(12) United States Patent
Saka

(10) Patent No.: US 7,252,519 B2
(45) Date of Patent: Aug. 7, 2007

(54) ELECTRICAL CONNECTOR BOX

(75) Inventor: Yuuji Saka, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 302 days.

(21) Appl. No.: 11/092,710

(22) Filed: Mar. 30, 2005

(65) Prior Publication Data

US 2005/0221640 A1 Oct. 6, 2005

(30) Foreign Application Priority Data

Apr. 2, 2004 (JP) .............................. 2004-109893

(51) Int. Cl.
*H01R 12/00* (2006.01)

(52) U.S. Cl. .................................................. 439/76.2

(58) Field of Classification Search ............... 439/76.2, 439/949, 620.27
See application file for complete search history.

(56) References Cited

U.S. PATENT DOCUMENTS

| | | | |
|---|---|---|---|
| 6,220,875 B1 * | 4/2001 | Kawakita | 439/76.2 |
| 6,670,548 B2 | 12/2003 | Sumida et al. | |
| 6,677,521 B2 | 1/2004 | Sumida et al. | |
| 6,919,509 B2 * | 7/2005 | Oda | 174/59 |
| 7,125,262 B2 * | 10/2006 | Saka | 439/76.2 |
| 2005/0026467 A1 * | 2/2005 | Smirra | 439/76.1 |

FOREIGN PATENT DOCUMENTS

| | | |
|---|---|---|
| JP | 2000-092660 | 3/2000 |
| JP | 2000-285988 | 10/2000 |
| JP | 2002-027634 | 1/2002 |
| JP | 2002-084630 | 3/2002 |

OTHER PUBLICATIONS

English Language Abstract of JP 2000-092660.
English Language Abstract of JP 2002-027634.
English Language Abstract of JP 2000-285988.
English Language Abstract of JP 2002-084630.
U.S. Appl. No. 11/092,853 to Yuuji Saka, filed Mar. 30, 2005.
U.S. Appl. No. 11/092,726 to Yuuji Saka, filed Mar. 30, 2005.
U.S. Appl. No. 11/000,189 to Yuuji Saka, filed Dec. 1, 2004.

* cited by examiner

*Primary Examiner*—Phuong Dinh
(74) *Attorney, Agent, or Firm*—Greenblum & Bernstein, P.L.C.

(57) ABSTRACT

An electrical connector box having a thin cross section by positioning the fuse receptacle and connector receptacles to the lateral sides of the case. An internal circuit block is located over the lower case; a relay module, on which multiple relays are installed on an insulator board, is located on the internal circuit block at the central region of the case; and a fuse module, on which multiple fuses are installed; and connector modules, on which multiple connector receptacles are respectively installed, are located externally around the perimeter of the relay module. An upper case covers the relay module, fuse module, and connector modules, and the fuse module and the connector modules are externally exposed in the horizontal direction between the lower case and the upper case.

6 Claims, 8 Drawing Sheets

ELECTRICAL CONNECTOR BOX

CROSS REFERENCE TO RELATED APPLICATIONS

The present disclosure relates to subject matter contained in priority Japanese Application No. 2004-109893, filed on Apr. 2, 2004, which is herein expressly incorporated by reference in its entirety.

BACKGROUND OF THE INVENTION

1. Field of the Invention

The invention relates to an electrical connector box, and more particularly to an electrical connector box including improved positioning of a relay module, fuse module, and connector module provided therein to reduce the height dimension of the electrical connector box.

2. Description of the Related Art

Japanese Kokai Patent Publication No. 2000-92660 is an example of a prior art automotive electrical connector box structure. The electrical connector box, as illustrated in FIG. 7, includes horizontal bus bars 5A through 5D alternately located between respective insulator boards 4A through 4D in a stacked configuration, tabs 5a that bend from bus bars 5A-5D at required locations, connector receptacle 6, relay receptacle 7, and fuse receptacle 8 extending outward from upper case 2 and lower case 3.

The electrical connector box 1 described by the JP 2000-92660, however, includes connector receptacle 6, relay receptacle 7, and fuse receptacle 8 which house electrical components such as connectors, relays, and fuses, and positions the receptacles on the external sides of upper case 2 and lower case 3 so as to project upward and downward therefrom, thus creating a structure that makes it difficult to reduce the height of the electrical connector box.

Further, Japanese Kokai Patent Publication No. 2002-27634 describes electrical connector box 100 that, as shown in FIG. 8, includes multiple relays 101 fixedly mounted to baseboard 102 within a case, and tabs 104 which connect to the conductors of electronic baseboard 103 and extend horizontally into connector receptacle 105.

Electrical connector box 100, however, as described by JP 2002-27634, utilizes tabs 106 that connect to wires 'w' of the internal circuit by extending into connector receptacle 108 on the external side of upper case 107. Because the plug-in connector that joins to wires 'w' of the internal circuit must be inserted from the top of upper case 107 (lower region of FIG. 8), it becomes difficult to reduce the thickness of the electrical connector box, and thus electrical connector box 100 exhibits the same shortcoming as previously described electrical connector box 1.

In particular, in applications where the electrical connector box is located within the instrument panel in front of the front seat, it is preferable that space be provided between the electrical connector box and instrument panel in order to provide a crush space that allows the instrument panel to bend inward in order to reduce the shock of collision should a quick stop result in the passenger striking the instrument panel. The space between the electrical connector box and instrument panel must be maintained even though the space within the instrument panel is limited. A problem exists in that no effort has been made to form the electrical connector box to thinner cross section.

SUMMARY OF THE INVENTION

In consideration of the shortcomings of the prior art, the present invention offers a structure for an electrical connector box of thin cross section that positions the fuse receptacle and connector receptacles, which conventionally project from the upper and lower sides of the connector box, to the side of the connector box case, and which positions the relays within the case.

An aspect of the present invention provides an electrical connector box including an internal circuit block positioned on an upper surface of a lower case; a relay module, on which multiple relays are provided on an insulator board, provided on the internal circuit block in a central region of the case; and a fuse module, on which multiple fuses are provided, and a connector module having multiple connector receptacles, the fuse module and the connector module being positioned around the perimeter of the relay module; wherein an upper case is positioned over the relay module, the fuse module, and the connector module, the fuse and connector modules being externally exposed on a lateral side of and between the upper case and the lower case. Further, relays in the relay module are connected through welding of their terminal ends to a bus bar secured to the insulator board, or soldering of their terminal ends to conductors on a printed circuit board; and the insertion direction of the fuses provided in the fuse module and the insertion direction of the connectors inserted into the receptacles of the connector module are disposed at 90-degrees relative to the installation direction of the relays.

In a further aspect of the present invention, an ECU is positioned between the relay module and the upper case, components attached to the ECU are provided opposite to the relays on the relay module; and terminals to be joined to the ECU conductors project into an ECU connector receptacle that extends from an edge of the ECU baseboard and joins to the connector module. Further, electrical wires are provided as the conductors of the internal circuit block provided on the lower case; and friction-type terminal ends connected to the wires extend into the connector receptacles formed in the connector module through terminal holes provided in the connector receptacles. Additionally, frame supports are provided at corners of the base plate of the substantially square-shaped lower case; the substantially square-shaped upper case is connected to the lower case through the frame supports with the fuse module provided at one side therebetween; and the connector module is positioned at a side of the case provided at a 90-degree angle relative to the fuse module side. Further, one end of the bus bars connected to the relay module and one end of the fuse connection terminals connected to the wires in the internal circuit block project into each fuse receptacle of the fuse module and connect to a fuse provided therein.

The present invention places the relays, which are conventionally installed in an external surface of the case (thus increasing the height of the electrical connector box), between the lower and upper cases in the central region of the case, and places the fuse and connector modules around the perimeter of the relay module at the sides of the case. This structure eliminates the placement of relay, fuse, and connector receptacles on top of the upper case and bottom of the lower case, thus allowing the electrical connector box to be made to thinner cross section due to the absence of electrical components protruding from the top and bottom of the case. Therefore, as noted previously, placing a more thinly formed electrical connector box within the instrument panel in front of the passenger seat provides more space between the surface of the instrument panel and electrical connector box, thereby providing a sufficient crush zone that protects the passenger by lessening the impact should the passenger strike the instrument panel as a result of quick braking or other like occurrence.

The insertion direction of the fuses provided in the fuse module and that of the connectors inserted into the receptacles of the connector module is oriented at 90-degrees relative to the insertion direction of the relays.

Plug-in type relays are not used because the present electrical relay box invention places the relays within the case, thus necessitating the use of relays that are, as previously noted, welded to an insulator board or circuit board. Moreover, the fuses and connectors that are located around the perimeter of the relay module are inserted in a direction at 90-degrees to the relay insertion direction. In other words, the relays are provided along the vertical axis between the lower and upper case, and the fuses and connectors are arranged around the relays in a horizontal orientation, thus making it possible to arrange multiple fuse and connector receptacles in a vertically stacked configuration that allows the electrical connector box to be made to thinner cross section while still providing adequate space for the installation of the fuses and connectors.

It is preferable that an ECU (electronic control unit) be placed between the relay module and upper case, the electrical components attached to said ECU be disposed in opposition to the relays on the relay module, and terminals that connect to the ECU conductors protrude into an ECU connector receptacle that extends from the edge of the ECU baseboard and joins to the connector module.

If the height of the connector module and fuse module is greater than the height of the relay module, the above-noted structure allows the components attached to the ECU to be located opposite the relay module in the space provided there above. This structure allows the space above the relay module to be effectively utilized by locating the components attached to the ECU therein, thus allowing the electrical connector box to be made to thinner cross section.

It is preferable that electrical wires serve as the conductors of the internal circuit block located on the lower case, and that friction-type terminal ends connected to said wires extend into the connector receptacles formed in the connector module through terminal holes provided in the connector receptacles.

Because electrical wires appropriate for low to mid-strength current applications may be used in the internal circuit which connects to the load side of the relays and fuses, the use of electrical wires, instead of bus bars, reduces cost and allows modifications or additions to the circuit to be easily undertaken.

It is preferable that frame supports be provided at the four corners of the base plate of the approximately square-shaped lower case, that the approximately square-shaped upper case connect to the lower case through said frame supports with the fuse module sandwiched at one side therebetween, and that the connector module be located on another side of the case at a 90-degree angle relative to the fuse module side.

This structure makes it possible to locate the fuse module and connector module at an externally exposed position between the lower and upper case, which are formed of approximately flat panels, at a location not occupied by the support frames at the four corners.

It is preferable that one end of the bus bars attached to the relay module and one end of the fuse connection terminals attached to the wires in the internal circuit block protrude into each fuse receptacle of the fuse module and connect to a fuse installed therein. This structure provides for easy attachment of fuses between the relay module and internal circuit wires.

As previously noted, the invention places the relay module within the central region of the case, and the fuse module and connector module around the perimeter of the relay module in an externally exposed orientation on the sides of the case. Because the relay, fuse, and connector receptacles are not located on top of the upper case or on the bottom of the lower case, the electrical connector box can be made to thinner cross section due to the absence of electrical components that protrude upward or downward from the case.

BRIEF DESCRIPTION OF THE DRAWINGS

The above, and other objects, features and advantages of the present invention will be made apparent from the following description of the preferred embodiments, given as nonlimiting examples, with reference to the accompanying drawings in which.

DETAILED DESCRIPTION OF THE INVENTION

Figure 1:
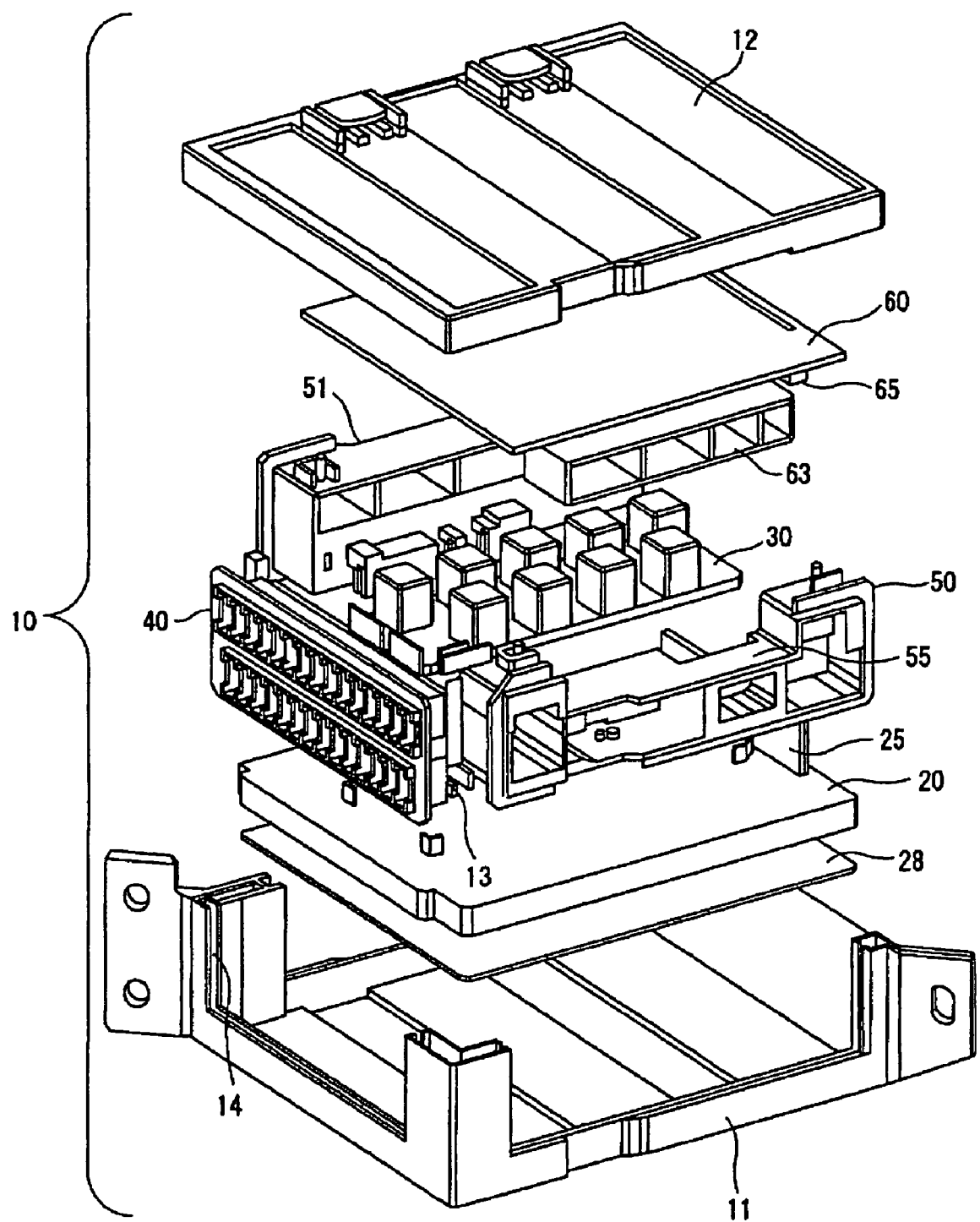
FIG. 1 is a perspective view of an electrical connector box according to an embodiment of the present invention.

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description is taken with the drawings making apparent to those skilled in the art how the forms of the present invention may be embodied in practice.

The following will describe an embodiment of the invention with reference to the drawings. FIGS. 1 through 6 describe an embodiment of the present invention including an electrical connector box 10 in which internal circuit block 20 is located above lower case 11, relay module 30 is located above internal circuit block 20 at the central region of the case, fuse module 40 and connector modules 50 and 51 are externally located around the perimeter of relay module 30, ECU (electronic control unit) 60 is located above relay module 30, and upper case 12 is located over the entire structure.

Figure 2:
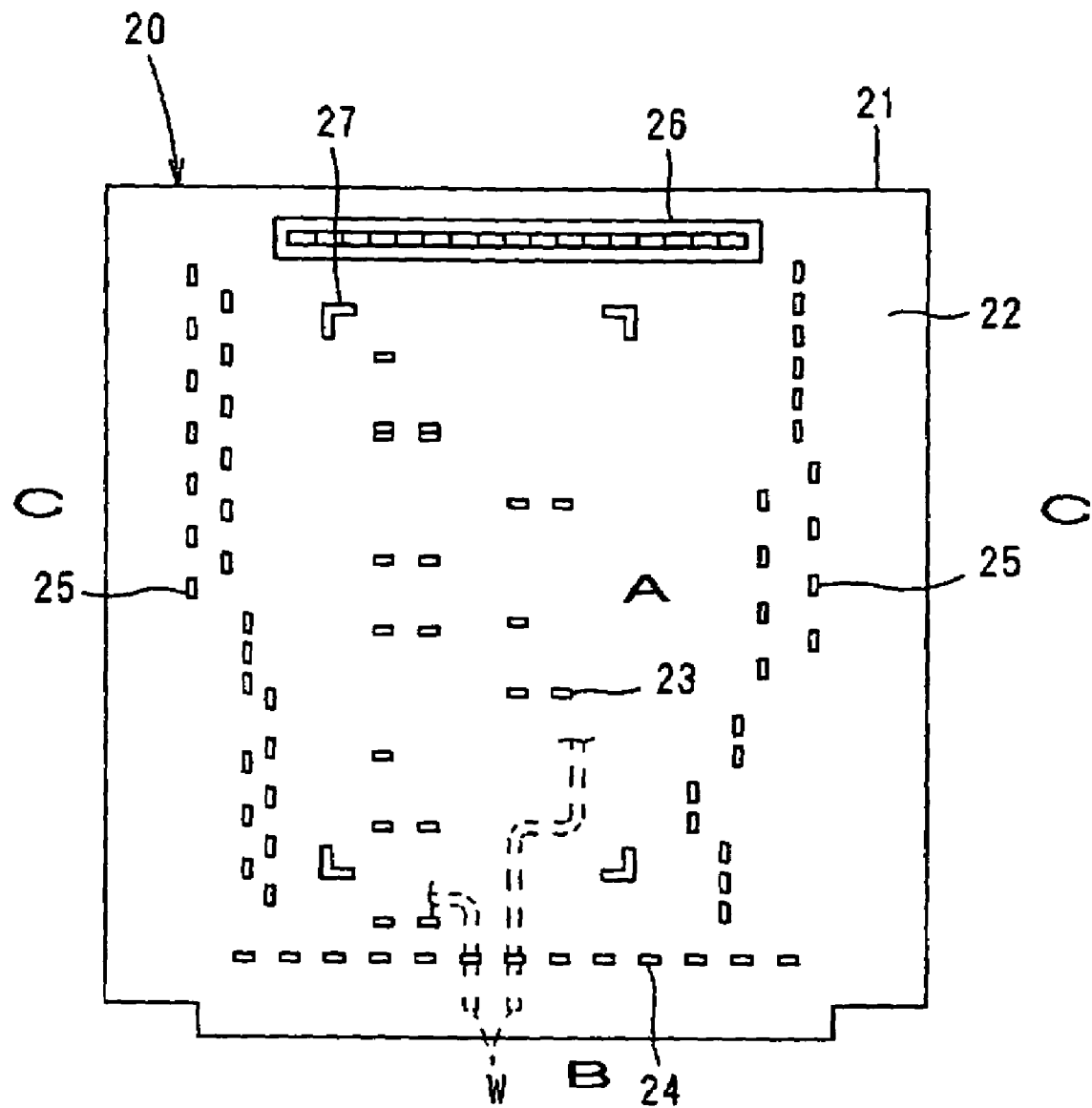
FIG. 2 is a top plan view of the internal circuit block of the embodiment of FIG. 1.

Wires 'w', which serve as the conductors of internal circuit block 20, are laid out below and housed within case 21 which is a box-type structure with an open bottom. As shown in FIG. 2, multiple terminal slots 23, 24, and 25 are formed within upper plate 22 of case 21 in proximity to relay module 30, fuse module 40, and connector module 50 and 51. Bus bar 32 of relay module 30, connecting terminals 43 of fuse module 40, and connecting terminals 54 of connector modules 50 and 51 pass through terminal slots 23, 24, and 25 respectively to connect to wires 'w' within case 21. Moreover, male connector 26 projects from the peripheral region of internal circuit block 20 not occupied by fuse module 40 and connector modules 50 and 51, and joins to female connector 65 of ECU 60 in order to connect the ECU conductors to wires 'w'. L-shaped indexing members 27 are provided at four locations within the central region of upper plate 22 of case 21 of internal circuit block 20 in order to locate the four corners of insulator board 31 of relay module 30 on upper plate 22. Moreover, insulator board 28 is positioned beneath internal circuit block 20.

Relay module 30 is located at the center of the case on internal circuit block 20, and bus bar 32, which has been press blanked from conductive sheet metal to the required shape, is fixedly attached to the top of insulator board 31. Relays 33, whose terminals have been welded to bus bar 32, are fixedly attached to insulator board 31. Moreover, relay module 30 may have the relays provided on a printed circuit board, and the relay terminals soldered to the conductors of a printed circuit board.

Figure 3:
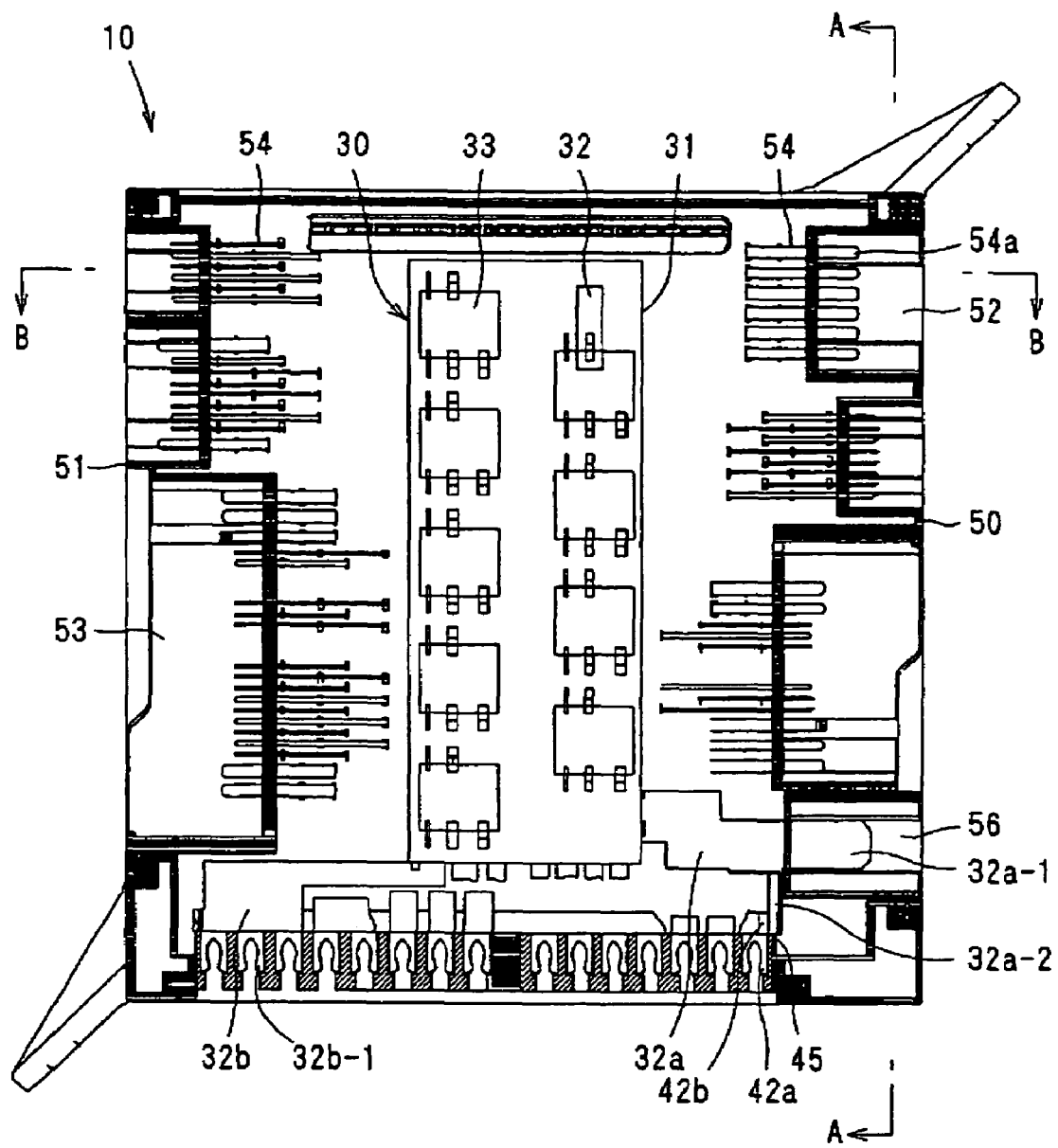
FIG. 3 is a cross sectional plan view of the electrical connector box of the embodiment of FIG. 1.
Figure 5:
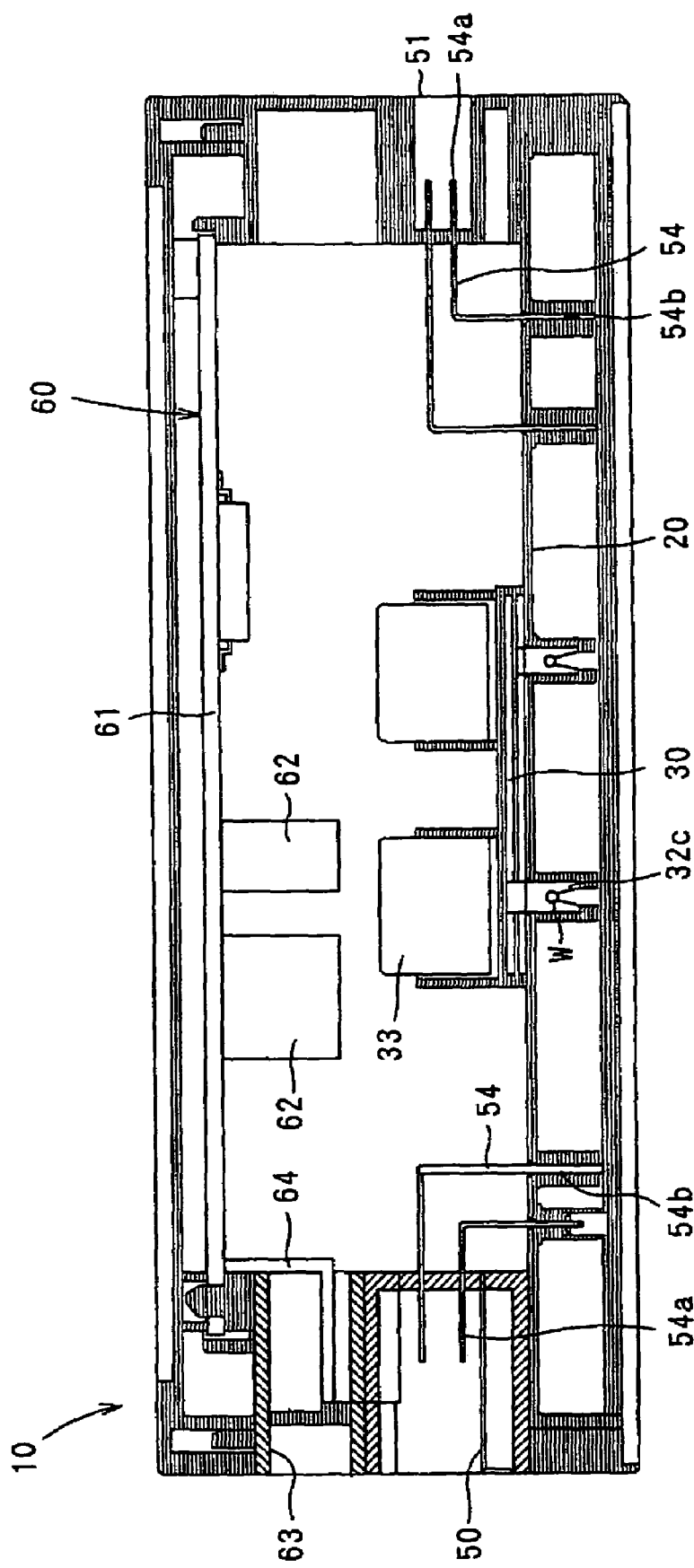
FIG. 5 is a cross sectional view through line B-B of FIG. 3 of the electrical connector box of the embodiment of FIG. 1.

As illustrated in FIG. 3, electrical power is supplied to relay module 30 through input bus bar 32a. Terminal end 32a-1 of input bus bar 32a extends into connector receptacle 56 which forms the power input part of connector module 50, and connects to a power terminal to be inserted therein. The other end of input bus bar 32a is soldered to the input terminals of relays 33. In regard to the output side of relay module 30, output bus bar 32b, which connects to fuses 44 of fuse module 40, extends horizontally from the edge of insulator plate 31, and the tips of friction tabs 32b-1 extend into fuse receptacles 41 of fuse module 40 to make friction connection to the input terminals of fuses 44. The part of output bus bar 32c that does not connect to fuses 44 extends beneath insulator board 31, through terminal slots 23 formed in case 21 of internal circuit block 20, to make friction connection to wires 'w' of the internal circuit block, as shown in FIG. 5.

Fuse module 40 is located on the forward facing surface of electrical connector box 10 (the lower region of the connector box as shown in FIG. 3) and contains two horizontal rows of fuse receptacles 41 that are externally exposed on the side of the connector box between lower case 11 and upper case 12. The upper and lower fuse receptacle rows 41 are mutually offset in the horizontal direction in a zig-zag pattern.

Figure 4:
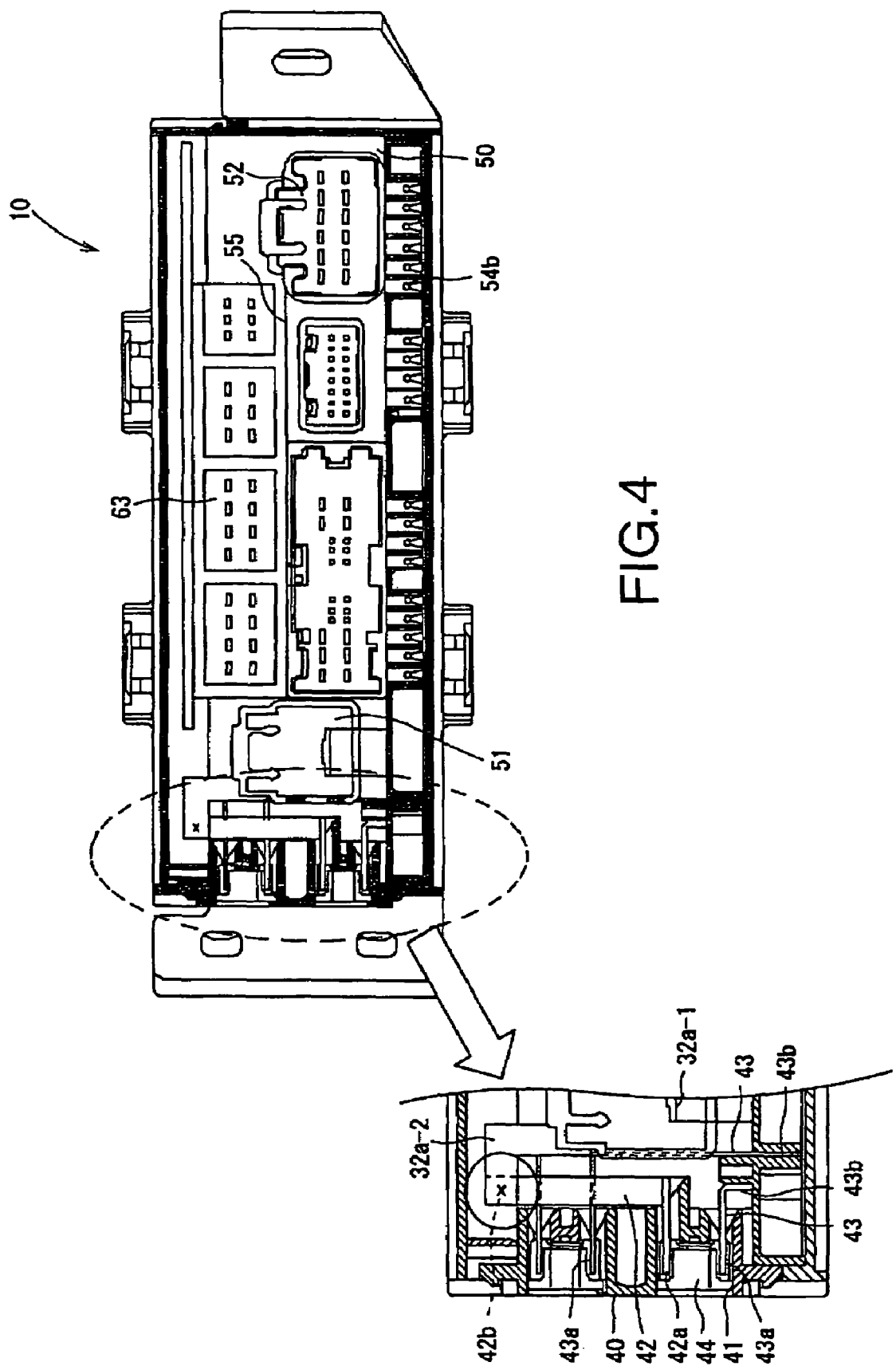
FIG. 4 is a cross sectional view through line A-A of FIG. 3 of the electrical connector box of the embodiment of FIG. 1.

Bus bar 42 connects to the input terminals of fuses 44 within fuse receptacles 41. One end of bus bar 42 is formed as friction tab 42a that makes frictional connection with the fuse 44 terminal, and the other end 42b extends toward connector module 50 on the right side of electrical connector box 10. Connecting part 42b is resistance welded to connector part 32a-2, which branches off from input bus bar 32a of relay module 30, to form welded joint 45. Therefore, attaching an electrical power connector to connector receptacle 56, which is the power input part of connector module 50, results in the supply of electrical power to both relay module 30 and fuse module 40. In addition, the input terminals of the fuses 44 that do not connect to bus bar 42 connect to friction tabs 32b-1 of bus bar 32b which extends from relay module 30. As shown in FIG. 4, L-shaped fuse connector terminals 43, each having two ends formed as friction connecting parts, connect to the output terminals of fuse 44. One end, which is end 43a, extends into fuse receptacle 41 to make frictional connection to the fuse 44 terminal, and the other end, which is end 43b, bends downward and passes through terminal slot 24 of case 21 of internal circuit block 20 to make connection to wires 'w'.

Connector modules 50 and 51, which are located on the right and left sides of electrical connector box 10, include multiple connector receptacles 52 and 53 which are externally exposed at the sides of the connector box between lower case 11 and upper case 12. Connector module 50, which is located on the right side, includes connector receptacle 56 which serves as the electrical power input part and which is externally exposed on the side of the connector box. In addition, cutout portion 55, which is formed as a void within the upper part of connector module 50, accommodates the installation of ECU 60 connector 63 therein.

Connectors 54, which are joined to the terminals within the mating connector inserted into connector receptacles 52 and 53, are all formed to an "L" shape. One end of each connector is formed as male tab 54a that extends into connector receptacle 52 and 53 for connection to the terminal in the mating connector, and the other end is formed as friction connector 54b that bends downward and extends through a terminal slot 25, which is provided in case 21 of internal circuit block 20, for connection to wire 'w' of the internal circuit.

Figure 6:
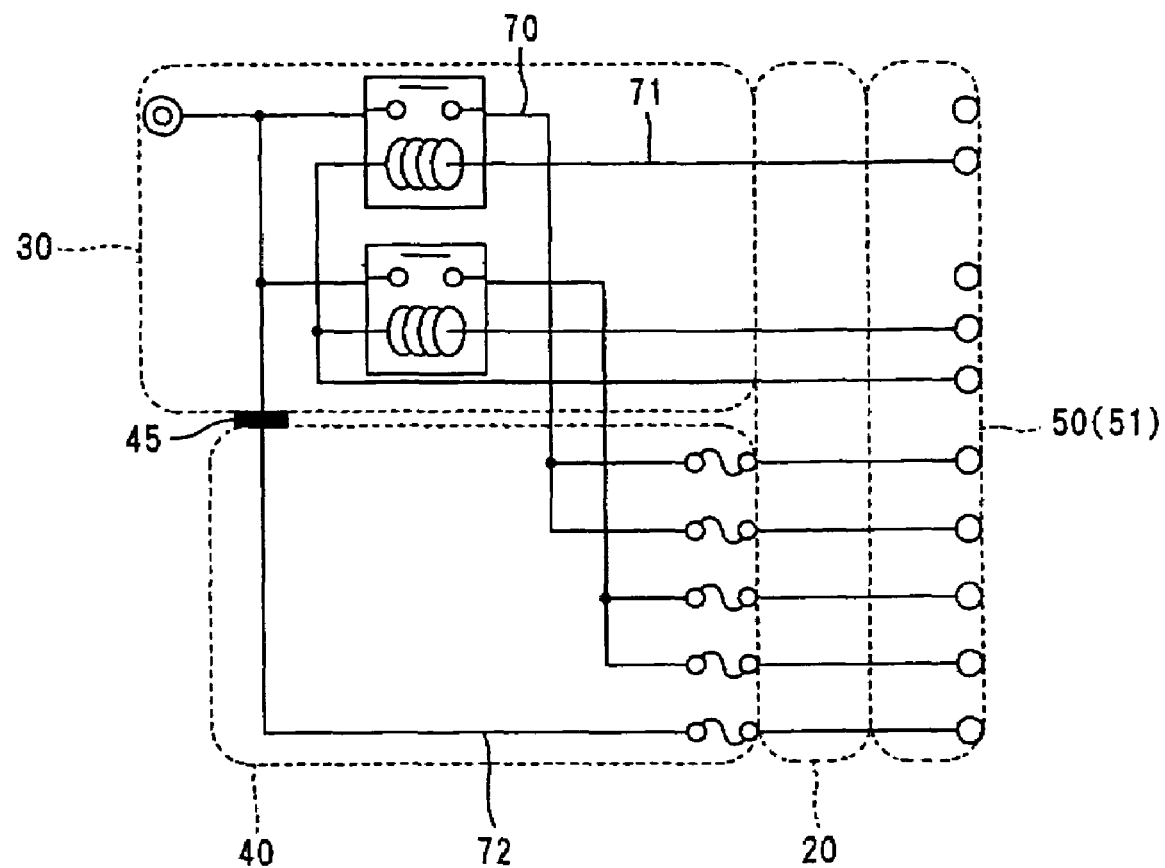
FIG. 6 is a circuit diagram of the relay module, fuse module, internal circuit block, and connector modules of the embodiment of FIG. 1.
Figure 7:
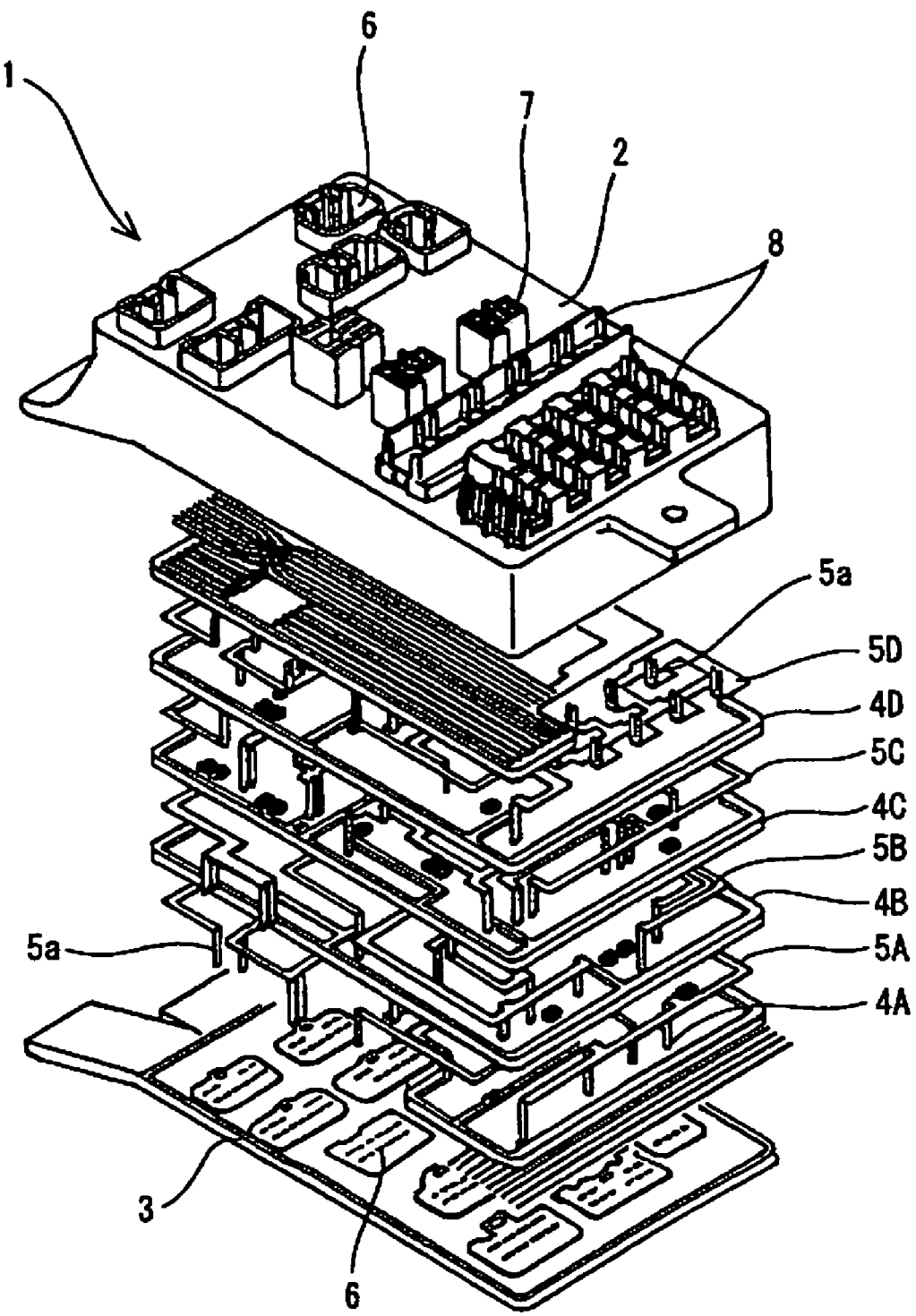
FIG. 7 is a prior art electrical connector box.
Figure 8:
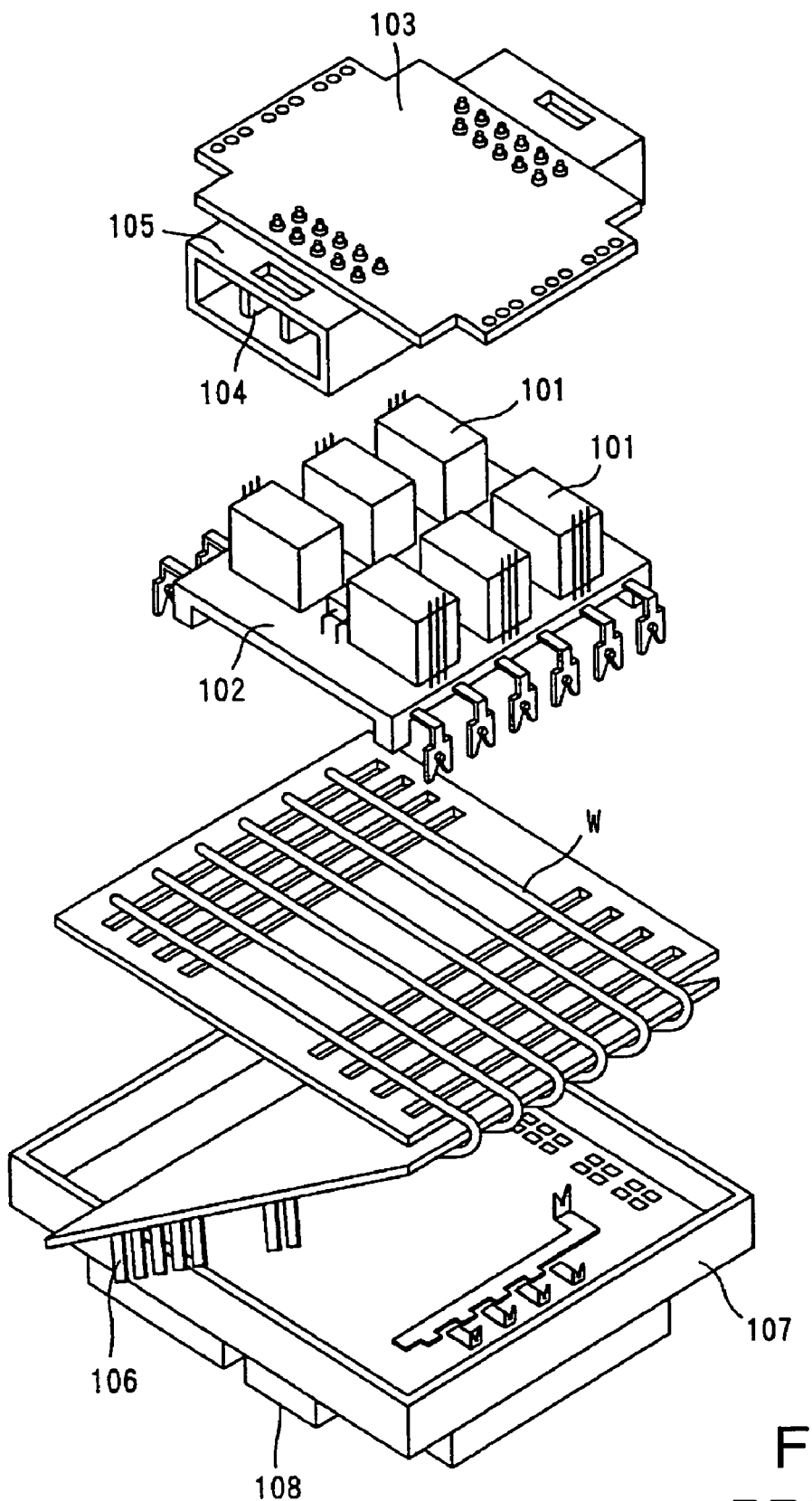
FIG. 8 is a prior art electrical connector box.

FIG. 6 is a circuit schematic of internal circuit block 20, relay module 30, fuse module 40, and connector modules 50 and 51. Power circuit 70, which supplies power to the load side, forms a connection between the power input part and connector modules 50 and 51 through relay module 30, fuse module 40, and internal circuit block 20. Control circuit 71, which provides a control function for power circuit 70, connects the power input part to connector modules 50 and 51 through relay module 30 and internal circuit block 20. Also, additional circuit 72 is connected to the power input part through welded joint 45 without going through relay 33 of relay module 30, and thus makes connection to connector modules 50 and 51 directly through fuse module 40 and internal circuit block 20.

In regard to ECU 60, as shown in FIG. 5, multiple electronic components 62, which have been soldered to conductors (not shown in the drawings) on the lower side of ECU baseboard 61, are located in opposition to relays 33 of relay module 30 which are positioned below ECU 60. ECU 60 female connector 65 projects downward along the lower edge of ECU baseboard 61 at the back side of electrical connector box 10. Female connector 65 joins to male connector 26 of internal circuit 20, thereby joining respective terminals within each connector in order to connect wires 'w' of the internal circuit to the conductors of ECU 60, and thus supply electrical power to ECU 60. Moreover, ECU connector 63 protrudes from the edge of ECU baseboard 60 and connects to cutout portion 55 of connector module 50. One end of contact terminals 64 connects to the conductors of ECU 60, and the other end extends into ECU connector 63 for connection to terminals of the mating connector to be inserted to ECU connector 63.

Frame supports 14 extend from the four corners of the floor plate of approximately square-shaped lower case 11, and lower case 11 joins to approximately square-shaped upper case 12 through frame supports 13. Fuse module 40 is located on the forward facing side of the assembly between lower case 11 and upper case 12, and connector modules 50 and 51 are located on the right and left sides respectively at 90-degree angles to fuse module 40. While multiple relays 33 are installed vertically on insulator board 31, fuses insert into fuse module 40 in a direction 90 degrees in relation to the connectors that insert into the receptacles of connector modules 50 and 51. Frame supports 14 are L-shaped structures incorporating guide channels formed in both ends, thereby providing a mechanism that guides the sliding insertion of the ends of each module into the guide channels.

The following will describe the procedure through which electrical connector box 10 is assembled. Insulator board 28 is initially installed into lower case 11 from the top followed by internal circuit block 20. Next, terminal end 32a-1 of relay module 30 input bus bar 32a is placed into connector receptacle 56 of connector module 50, friction tabs 32b-1 of output bus bar 32b are inserted into fuse receptacle 41 of fuse module 40, and connector part 32a-2 of input bus bar 32a and connecting part 42b of fuse module 40 bus bar 42 in fuse module 40, which mutually overlap, are joined through resistance welding. Relay module 30, fuse module 40, and connector modules 50 and 51, which have been joined together, are then placed onto internal circuit block 20 as a single assembly. At this time, the connector terminal of each module and bus bar friction tabs are inserted through the terminal slots in case 21 of internal circuit block 20, and frictionally connected to wires 'w' that form the internal circuit. The ECU is then placed on top of the modules, and female connector 65 is joined to male connector 26 of internal circuit block 20 to make connection between wires 'w' of the internal circuit and the ECU 60 conductors. Also, ECU connector 63 joins to cutout portion 55 in connector module 50. Lastly, upper case 12 is placed over the assembly and connected to lower case 1 through frame supports 13.

Because this structure locates relay module 30 at the central region of the case, and fuse module 40 and connector modules 50 and 51 at locations surrounding relay module 30 and externally exposed at the sides of the case, fuses and connectors need not be attached to the top of upper case 12 nor to the bottom of lower case 11, thus making it possible to eliminate electrical components that protrude from the top and bottom of the case and to construct electrical connector box 10 to thinner cross section. Particularly in applications where electrical connector box 10 is located within the instrument panel in front of the front seat, thinly formed electrical connector box 10 provides more space between the instrument panel and the connector box, therefore allowing the instrument panel to sufficiently bend inward in order to reduce the shock of collision should a quick stop result in the passenger striking the instrument panel. Also, the passenger can be further protected by positioning electrical connector box 10 at a location where there is no danger of the passenger striking it.

Although the invention has been described with reference to an exemplary embodiment, it is understood that the words that have been used are words of description and illustration, rather than words of limitation. Changes may be made within the purview of the appended claims, as presently stated and as amended, without departing from the scope and spirit of the invention in its aspects. Although the invention has been described with reference to particular means, materials and embodiments, the invention is not intended to be limited to the particulars disclosed. Rather, the invention extends to all functionally equivalent structures, methods, and uses such as are within the scope of the appended claims.

What is claimed is:

1. An electrical connector box comprising:
    an internal circuit block positioned on an upper surface of a lower case;
    a relay module, on which multiple relays are provided on an insulator board, provided on said internal circuit block in a central region of said case; and
    a fuse module, on which multiple fuses are provided, and a connector module having multiple connector receptacles, said fuse module and said connector module being positioned around the perimeter of said relay module;
    wherein an upper case is positioned over said relay module, said fuse module, and said connector module, said fuse and connector modules being externally exposed on a lateral side of and between said upper case and said lower case.

2. The electrical connector box according to claim 1, wherein relays in said relay module are connected through welding of their terminal ends to a bus bar secured to said insulator board, or soldering of their terminal ends to conductors on a printed circuit board; and
    the insertion direction of the fuses provided in said fuse module and the insertion direction of the connectors inserted into the receptacles of the connector module are disposed at 90-degrees relative to the installation direction of the relays.

3. The electrical connector box according to claim 1, wherein an ECU is positioned between said relay module and said upper case, components attached to said ECU are provided opposite to the relays on said relay module; and
    terminals to be joined to the ECU conductors project into an ECU connector receptacle that extends from an edge of the ECU baseboard and joins to said connector module.

4. The electrical connector box according to claim 1, wherein electrical wires are provided as the conductors of said internal circuit block provided on the lower case; and
    friction-type terminal ends connected to said wires extend into the connector receptacles formed in said connector module through terminal holes provided in the connector receptacles.

5. The electrical connector box according to claim 1, wherein frame supports are provided at corners of the base plate of the substantially square-shaped lower case;
    the substantially square-shaped upper case is connected to the lower case through said frame supports with said fuse module provided at one side therebetween; and
    said connector module is positioned at a side of the case provided at a 90-degree angle relative to the fuse module side.

6. The electrical connector box according to the claim 5 wherein one end of the bus bars connected to said relay module and one end of the fuse connection terminals connected to the wires in said internal circuit block project into each fuse receptacle of said fuse module and connect to a fuse provided therein.

* * * * *